(12) United States Patent
Miyoshi

(10) Patent No.: US 8,264,620 B2
(45) Date of Patent: *Sep. 11, 2012

(54) IMAGE PROCESSOR AND IMAGE PROCESSING METHOD

(75) Inventor: Eisuke Miyoshi, Shinagawa-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/046,583

(22) Filed: Mar. 11, 2011

(65) Prior Publication Data

US 2011/0157466 A1    Jun. 30, 2011

Related U.S. Application Data

(63) Continuation of application No. 12/486,571, filed on Jun. 17, 2009, now Pat. No. 7,929,063.

(30) Foreign Application Priority Data

Sep. 19, 2008    (JP) .................................. 2008-240243

(51) Int. Cl.
*H04N 5/50* (2006.01)
*H04N 5/60* (2006.01)

(52) U.S. Cl. ........................................ 348/738; 348/569

(58) Field of Classification Search .................. 348/738, 348/480, 482, 484, 569, 553; 381/306, 333, 381/56, 77, 104; 704/270, 201, 200.1, 500, 704/501

See application file for complete search history.

(56) References Cited

U.S. PATENT DOCUMENTS

| | | | |
|---|---|---|---|
| 4,907,082 A | 3/1990 | Richards | |
| 5,548,346 A | 8/1996 | Mimura et al. | |
| 5,768,393 A | 6/1998 | Mukojima et al. | |
| 6,067,126 A | 5/2000 | Alexander | |
| 6,148,085 A * | 11/2000 | Jung | ............................. 381/104 |
| 6,804,827 B1 * | 10/2004 | Furukawa et al. | ............ 725/140 |

(Continued)

FOREIGN PATENT DOCUMENTS

CN    1203493    12/1998

(Continued)

OTHER PUBLICATIONS

Chinese Patent Application No. 200910158952.5, Notification of the First Office Action, mailed May 25, 2011, (with English Translation).

(Continued)

*Primary Examiner* — Victor Kostak
(74) *Attorney, Agent, or Firm* — Blakely, Sokoloff, Taylor & Zafman LLP

(57) ABSTRACT

According to one embodiment of the invention, an electronic apparatus comprises a receiving module, a configuration module, a selection module and a control module. The receiving module is configured to receive video information containing a plurality of pieces of audio information in different languages. The audio information is compressed in arbitrary audio compression formats. The configuration module is configured to control the display of a configuration screen for enabling an adjustment of an audio volume for each of the audio compression formats by a user. The selection module is configured to control the display of a selection menu for enabling a selection of languages, namely select a language for audio output among the languages being displayed while the received video information is displayed. The control module is configured to adjust the audio volume according to the selected language referring to a configuration set by the configuration module.

18 Claims, 9 Drawing Sheets

U.S. PATENT DOCUMENTS

| | | |
|---|---|---|
| 6,829,018 B2 | 12/2004 | Lin et al. |
| 7,702,117 B2 | 4/2010 | Crocitti et al. |
| 7,929,063 B2 * | 4/2011 | Miyoshi ................. 348/738 |
| 2003/0078687 A1 | 4/2003 | du Breuil |
| 2004/0190862 A1 * | 9/2004 | Ishiguchi ................. 386/46 |
| 2005/0285980 A1 | 12/2005 | Katayama |
| 2006/0190980 A1 | 8/2006 | Kikkoji et al. |
| 2009/0249393 A1 | 10/2009 | Shelton et al. |

FOREIGN PATENT DOCUMENTS

| | | |
|---|---|---|
| EP | 0462718 | 12/1991 |
| GB | 2326547 | 12/1998 |
| JP | 06013925 | 1/1994 |
| JP | 06177686 | 6/1994 |
| JP | 11127114 | 5/1999 |
| JP | 2001054037 | 2/2001 |
| JP | 2002165152 | 7/2002 |
| JP | 2002369097 | 12/2002 |
| JP | 2004037823 | 5/2004 |
| JP | 3122865 | 6/2006 |
| JP | 2007228159 | 9/2007 |
| JP | 2007265497 | 10/2007 |
| JP | 2007312055 | 11/2007 |
| WO | 2005109635 | 11/2005 |

OTHER PUBLICATIONS

Japanese Office Action dated Sep. 1, 2009 for application No. 2008-240243 (U.S. Appl. No. 12/486,571), entitled Electronic Apparatus and Method for Adjusting Audio Level. (English Translation).

Japanese Office Action dated Dec. 8, 2009 for application No. 2008-240243 (U.S. Appl. No. 12/486,571), entitled Electronic Apparatus and Method for Adjusting Audio Level. (English Translation).

Japanese Office Action dated Mar. 2, 2010 for application No. 2008-240243 (U.S. Appl. No. 12/486,571), entitled Electronic Apparatus and Method for Adjusting Audio Level. (English Translation).

English Search Report dated May 3, 2010 for application No. 09162840.4 (U.S. Appl. No. 11/512,495), entitled Electronic Apparatus. (English Translation).

* cited by examiner

IMAGE PROCESSOR AND IMAGE PROCESSING METHOD

CROSS REFERENCE TO RELATED APPLICATION(S)

This application is a continuation of U.S. patent application Ser. No. 12/486,571, filed Jun. 17, 2009 now U.S. Pat. No. 7,929,063, which claims the benefit of priority on Japanese Patent Application No. 2008-240243 filed on Sep. 19, 2008, the contents of which are incorporated herein by reference in its entirety.

FIELD

The present invention relates to an electronic apparatus and a method for adjusting audio level.

BACKGROUND

There has been known a volume adjusting apparatus having a volume control circuit that controls the volume of an input audio signal, a user interface that is connected to the volume control circuit and capable of adjusting volume via the volume control circuit when operated by a user, an indicator that indicates an operating amount of a volume adjusting operation made to the user interface, a flash memory that stores an operation history and their audio output levels of volume adjusting operations as a volume indicated value/output level table, and a microcomputer that controls the volume control circuit. An example of such apparatus is disclosed in JP-A-2004-037823.

According to this volume adjusting apparatus, the microcomputer stores a history of 100 operations as a table showing relations between a volume indicated value and an output level in the flash memory, and calculates an average value of the history of 100 operations. The microcomputer controls the indicator to display the operation amount near the average value in more detail. Accordingly, the apparatus allows the user to set a desired volume more precisely.

However, there is a problem in the conventional volume adjusting apparatus that, in a case where the audio signal to be output is selected from a plurality of audio signals having different volume levels, the user is required to manually adjust the audio volume to the desired level each time the audio signal to be output is changed.

BRIEF DESCRIPTION OF THE DRAWINGS

A general configuration that implements the various feature of the invention will be described with reference to the drawings. The drawings and the associated descriptions are provided to illustrate embodiments of the invention and not to limit the scope of the invention.

DETAILED DESCRIPTION OF THE EMBODIMENTS

Hereinafter, an embodiment of an electronic apparatus and a method for adjusting audio of the present invention will be described in detail with reference to the drawings.

Figure 1:
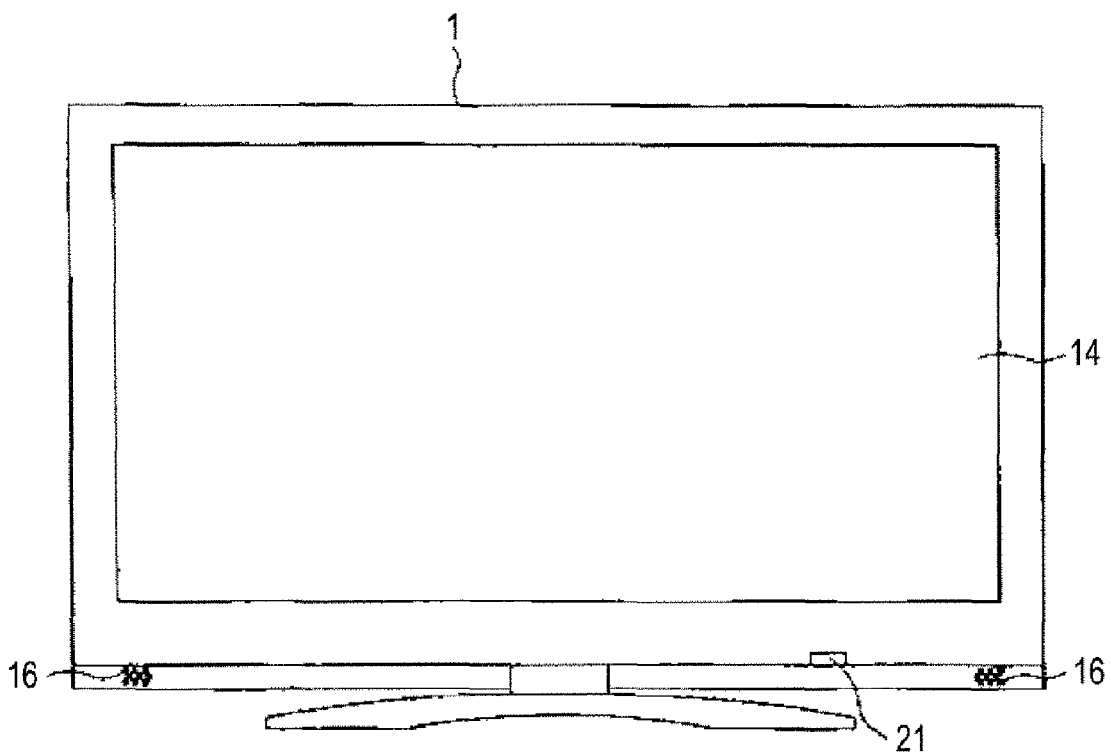
FIG. 1 is a schematic diagram showing an image display apparatus according to an embodiment of the present invention.
Figure 1:
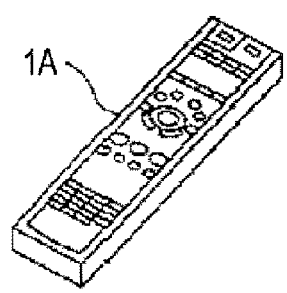

FIG. 1 is a schematic diagram showing an image display apparatus according to an embodiment of the present invention. An example that an electronic apparatus of the present invention is used as an image display apparatus 1 will be described.

The image display apparatus 1 is, as an example, a television receiver which is capable of receiving video information which will be described later from a digital broadcast wave or the like from the outside via an antenna (not shown) to display an image on an image display unit 14, and of receiving video information via an interface which will be described later from an external device such as an HDD (Hard Disk Drive) recorder or a DVD (Digital Versatile Disc) player (not shown) to display an image on the image display unit 14. The image display apparatus 1 is provided with: the image display unit 14 having a display device such as an LCD (Liquid Crystal Display) displaying an image; a speaker unit (an audio output module) 16 that outputs audio; and an infrared receiver 21 that receives an infrared command signal transmitted from a remote control 1A having a plurality of buttons for inputting commands.

The image display apparatus 1 is further provided with an antenna terminal, an external input terminal, an user interface having a plurality of buttons (not shown) on its back face, and includes electronic components including a CPU (Central Processing Unit) for processing video information and audio information and controlling other components, a RAM (Random Access Memory), a ROM (Read Only Memory), and an HDD (storage module) inside the main body.

Figure 2:
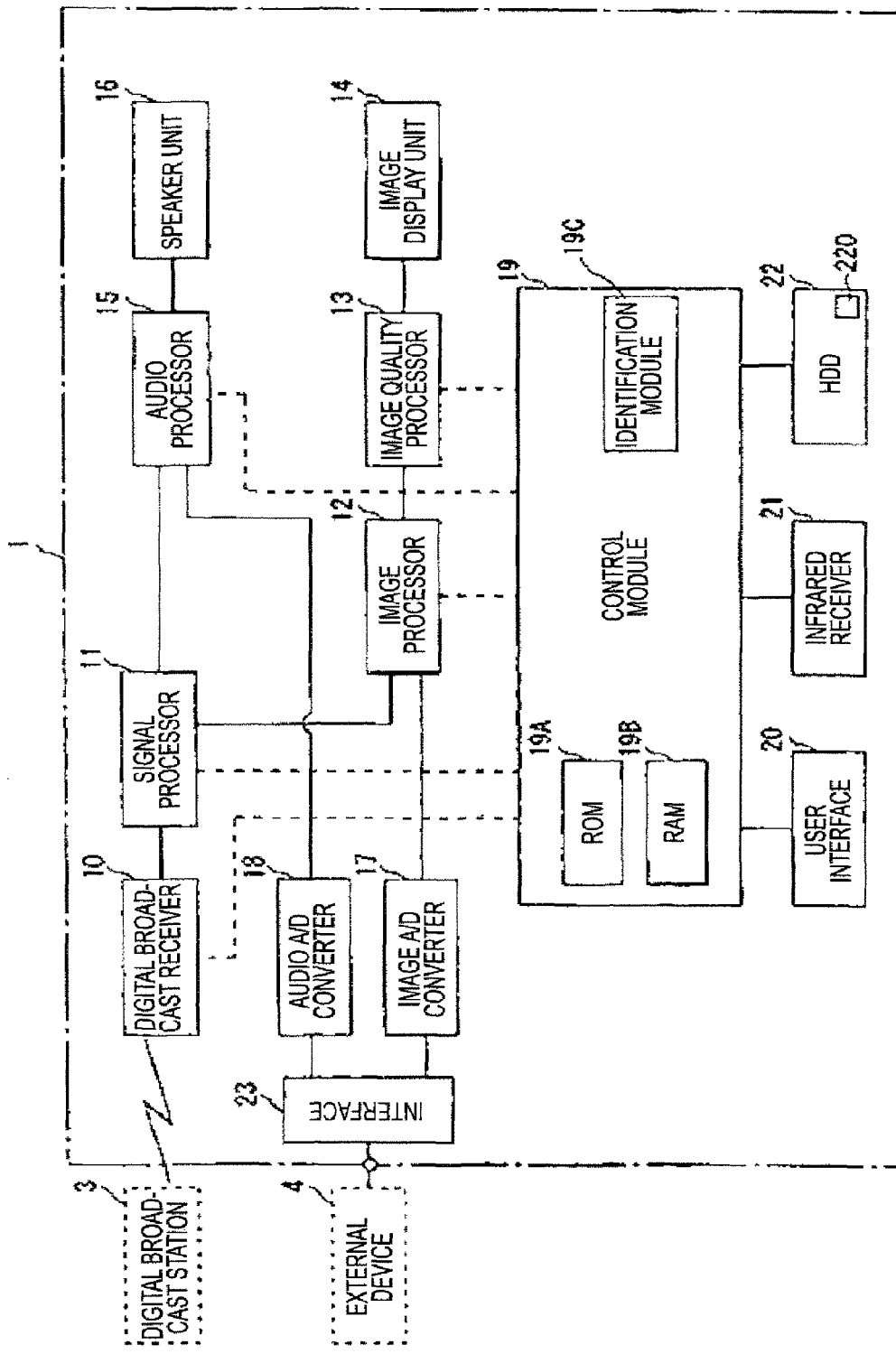
FIG. 2 is a block diagram showing a configuration example of the image display apparatus according to the embodiment of the present invention.

FIG. 2 is a block diagram showing a configuration of the image display apparatus 1 according to the embodiment. The image display apparatus 1 includes a digital broadcast receiver (video receiving module) 10 that receives a television broadcast from a digital broadcast station 3, and the output of the digital broadcast receiver 10 is connected to a signal processor 11. The signal processor separates received video information into image information and audio information, and the output of the signal processor 11 is respectively connected to an image processor 12 and an audio processor (identification module) 15.

The output of the audio processor 15 is connected to the speaker unit 16, and the output of the image processor 12 is connected to the image display unit 14 via an image quality processor 13 that adjusts image quality.

Further, the image display apparatus 1 has an image A/D converter 17 that receives image information transmitted from an external device 4 connected to an interface (video receiving module) 23, and an audio A/D converter 18 that receives audio information transmitted from the external device 4. The image information and the audio information input to the image A/D converter 17 and the audio A/D converter 18 are converted from the analog signals into digital signals, and the outputs of those are respectively connected to the image processor 12 and the audio processor 15. Note that, in a case in which the external device 4 connected to the interface 23 is a device capable of outputting digital signals, the image A/D converter 17 and the audio A/D converter 18 transmit digital signals to be input to the image processor 12 and the audio processor 15 directly.

The image display apparatus 1 has a control module 19 that controls the respective components and modules via control lines shown by dotted lines in FIG. 2, and an user interface 20 provided with buttons and switches and the infrared receiver 21 that receives an infrared command signal from the remote control 1A are connected to the control module 19.

The control module 19 is provided with a ROM 19A that stores programs for controlling the respective components and modules, a RAM 19B that temporarily stores information to assist the operation of the control module 19, and an identification module 19C that identifies a type of audio information 52.

Further, an HDD 22 serving as a storage module is connected to the control module 19. The HDD 22 stores setting information 220 which will be described later therein.

Figure 3:
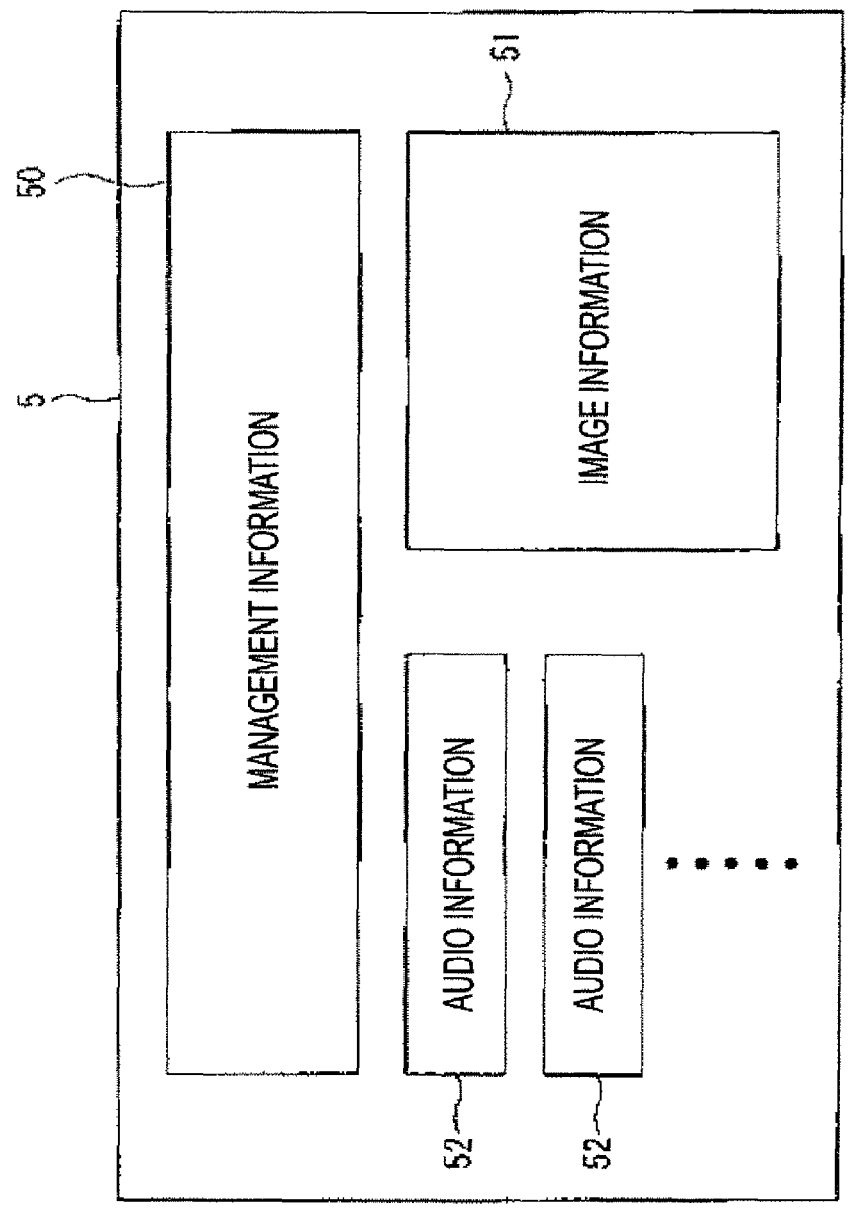
FIG. 3 is a schematic diagram showing video information according to the embodiment of the present invention.
Figure 4A:
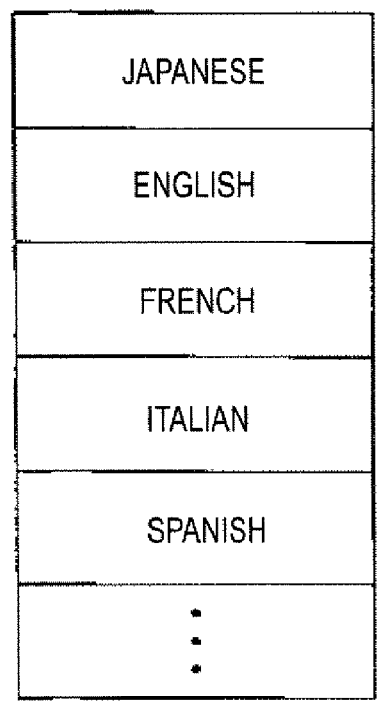
FIG. 4A is a schematic diagram of languages provided as audio information according to the embodiment of the present invention.
Figure 4B:
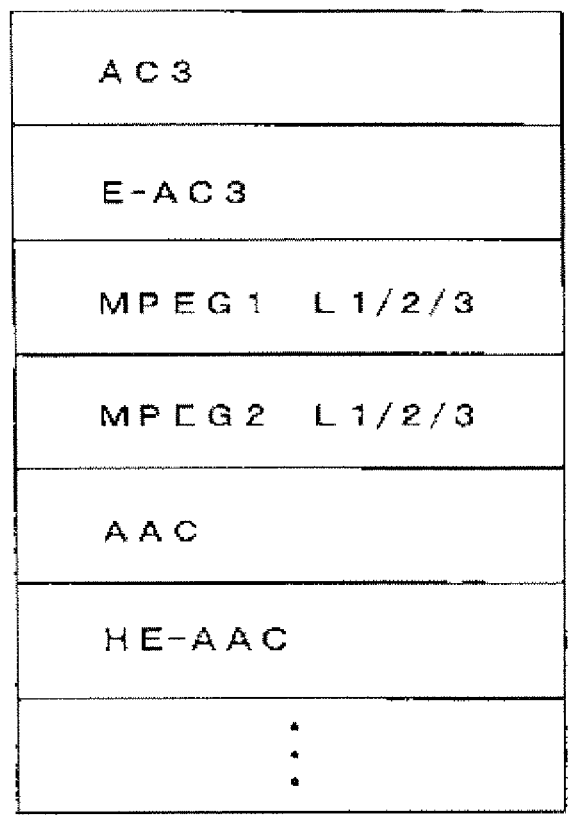
FIG. 4B is a schematic diagram of types of audio formats provided as audio information.

FIG. 3 is a schematic diagram showing video information according to the embodiment of the present invention. FIG. 4A is a schematic diagram of languages provided as audio information according to the embodiment of the present invention, and FIG. 4B is a schematic diagram of types of audio formats provided as audio information.

As shown in FIG. 3, video information 5 includes management information 50 for managing image information 51 and the audio information 52, the image information 51 serving as information on an image to be displayed on the image display unit 14 and the and the audio information 52.

In the example described herein, a plurality of pieces of the audio information 52 are included in the video information 5, and each of the pieces of audio information respectively correspond to different languages or different types of audio formats, for example.

The video information 5 includes a plurality of pieces of audio information 52, such as "Japanese," "English," "French," "Italian," and "Spanish," as languages as shown in the example of FIG. 4A. For example, a user may select an English version of audio signal by selecting "English" for the audio information 52.

The video information 5 includes a plurality of pieces of audio information 52 such as "AC3," "E-AC3," "MPEG1 L1/2/3," "MPEG2 L1/2/3," "AAC," and "HE-AAC," as types of audio formats as shown in the example of FIG. 4B. For example, a user may select an AAC audio signal being encoded and decoded in AAC standard by selecting "AAC" for the audio information 52. The audio information 52 may be configured to have a combination of the languages and types described above. That is, as an example, the audio information 52 may be information in which its language is "Japanese" and its audio format is "AAC."

Figure 5:
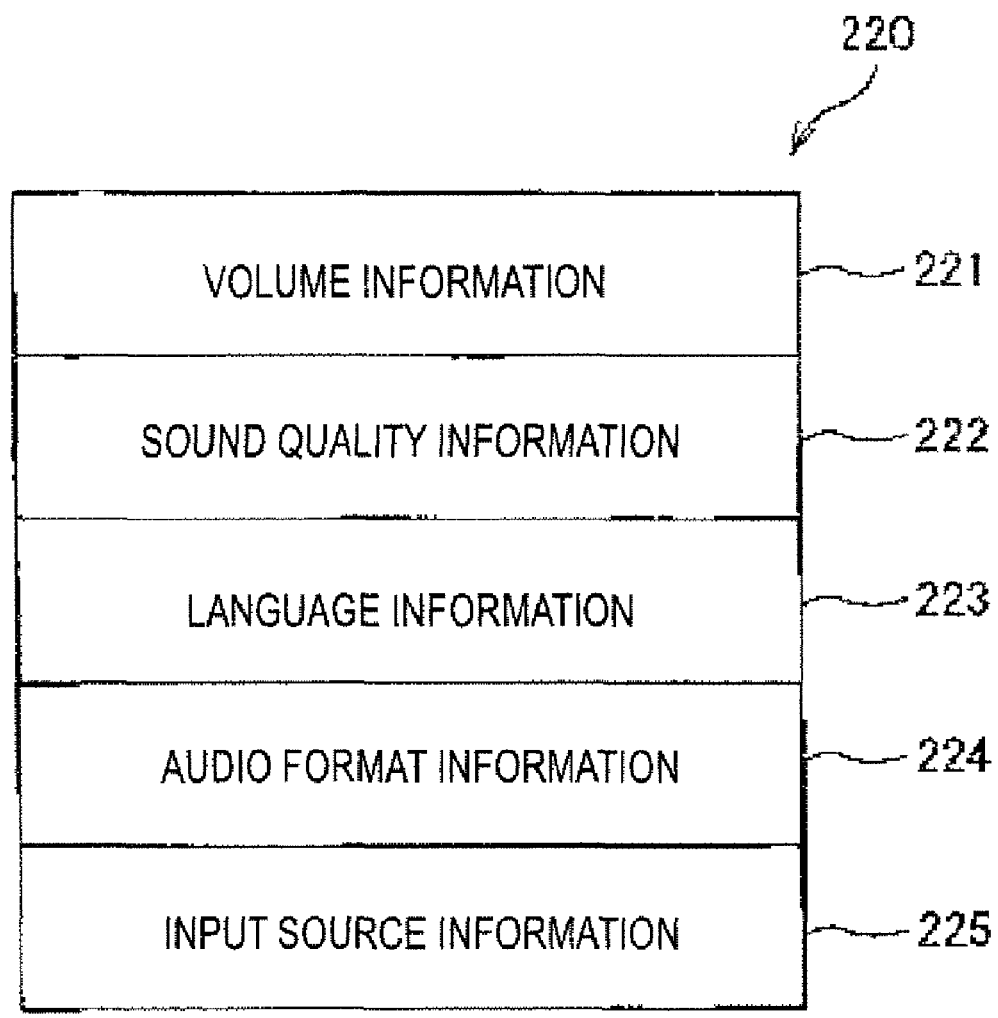
FIG. 5 is a schematic diagram of setting information according to the embodiment of the present invention.

FIG. 5 is a schematic diagram of setting information according to the embodiment. As shown in the example of FIG. 5, the setting information 220 includes: volume information 221 serving as information on volume level output from the speaker 16, sound quality information 222 serving as information on sound quality, language information 223 indicating a type of a language selected in setting, audio format information 224 indicating a type of audio format selected in setting, and input source information 225 serving as information on an input source from which the audio information 52 is input.

For example, when a specific language is selected by a user, the control module 19 is configured to retrieve the setting information 220 corresponding to the selected language from the HDD 22, to control an output of audio in accordance with the setting information 220.

The input source information 225 is information indicating, for example, whether the video information 5 is input from the digital broadcast receiver 10 or the interface 23. For example, the video information 5 is input to the interface 23 in a variety of input modes such as a "DTV (digital tuner)," an "ATV (analog tuner)," an "INPUT," and an "HDMI" as its connection modes, and there are respectively differences in their volumes in some cases. Therefore, the setting information 220 which will be described later is set in accordance with an input mode of information, to adjust an output level, which makes it possible to resolve the differences in the volume levels.

Figure 6:
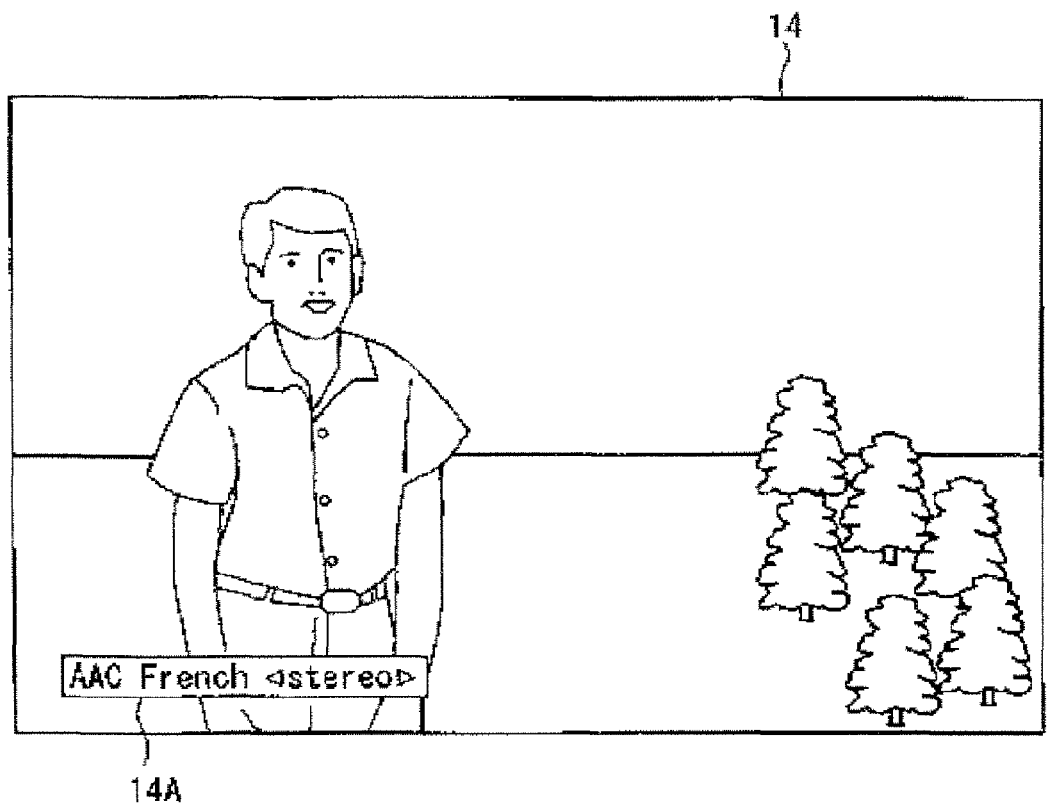
FIG. 6 is a schematic diagram showing the displayed content of the image display apparatus according to the embodiment of the present invention.

FIG. 6 is a schematic diagram showing the displayed content of the image display apparatus according to the embodiment. FIG. 6 shows a situation where a language and a type of audio currently selected are displayed in a language window 14A. The content displayed in the language window 14A shown in FIG. 6 shows that the language is "French" and the type of audio is in stereo by "AAC." This language window 14A may be displayed by pressing a predetermined button of the remote control 1A, or may be displayed for a predetermined period after the electric power source of the image display apparatus 1 is turned on.

Figure 7A:
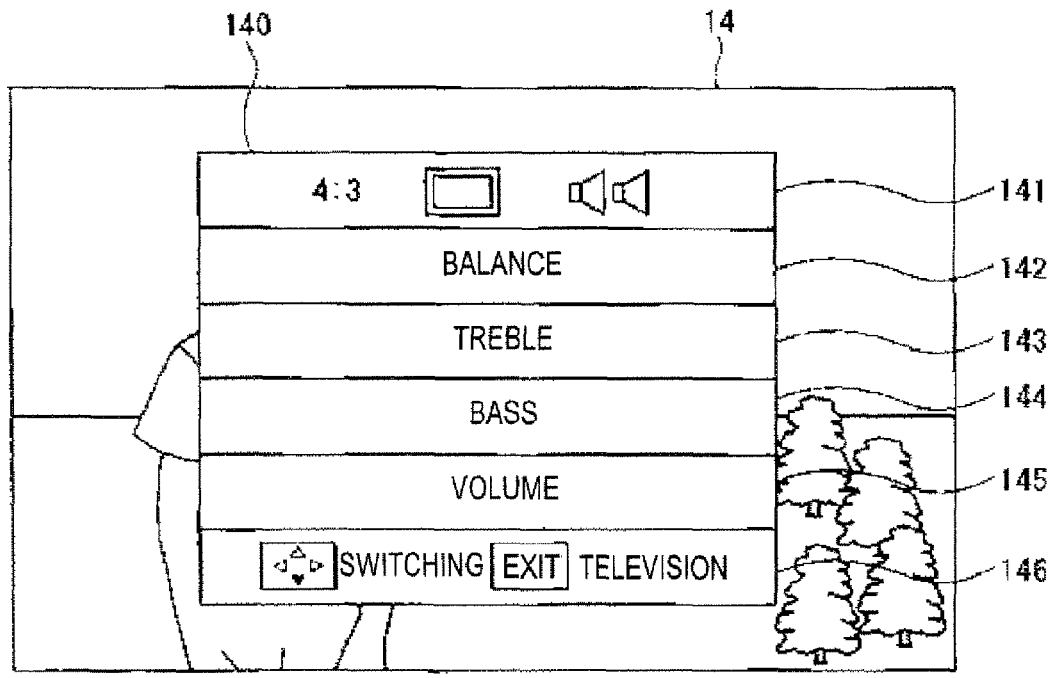
FIG. 7A is a schematic diagram of the image display unit, on which setting items are displayed, according to the embodiment of the present invention.
Figure 7B:
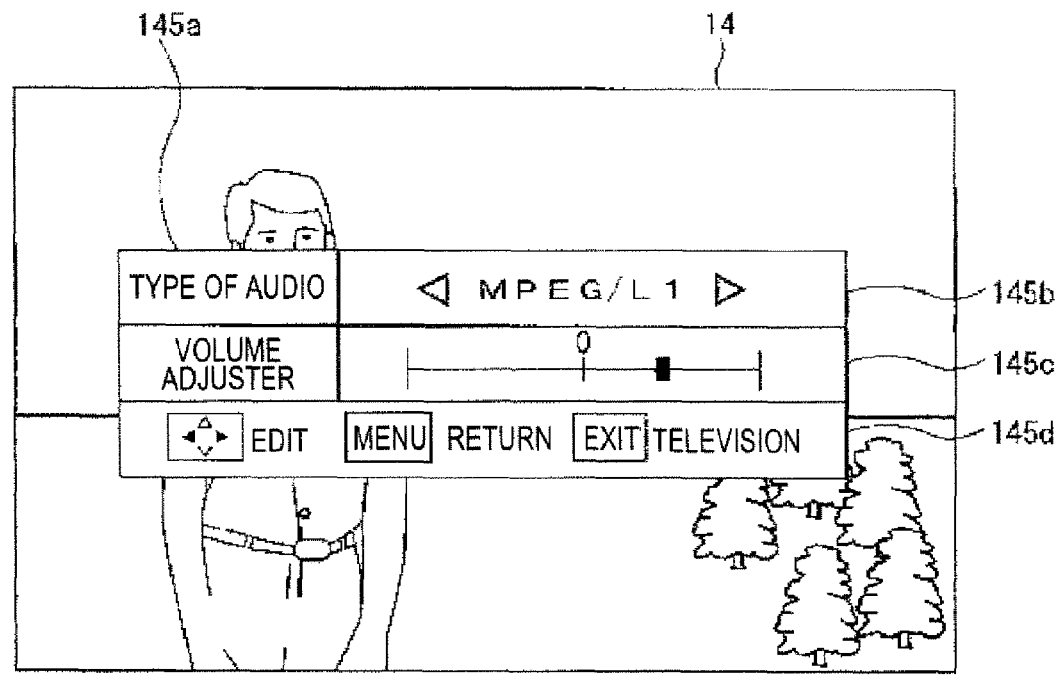
FIG. 7B is a schematic diagram of the image display unit on which selected volume setting items are displayed.

FIG. 7A is a schematic diagram of the image display unit, on which setting items are displayed, according to the embodiment, and FIG. 7B is a schematic diagram of the image display unit on which selected volume setting items are displayed. FIG. 7A shows a case in which items for adjusting audio are selected.

As an example, the setting items 140 are, as shown in FIG. 7A, include an icon group 141 in which icons and the like by which it is possible to switch the screen to an item to set an aspect ratio or the like of an image to be displayed on the image display unit 14 are displayed, a balance 142 which is selected to be able to move an item to adjust the balance between right and left audio, a treble 143 which is selected to be able to move to an item to adjust a high-pitched sound in audio, a bass 144 which is selected to be able to move to an item to adjust a low-pitched sound in audio, a volume 145 which is selected to be able to move to an item to adjust volume, and an icon group 146 in which a plurality of icons corresponding to the buttons of the remote control 1A are displayed. The balance 142, the treble 143, the bass 144, and the volume 145 are examples of adjustment information for adjusting an output level of audio to be output.

Further, the setting items 145a show a screen to be displayed on the image display unit 14 after the volume 145 shown in FIG. 7A is selected. As an example, the setting items 145a includes a type of audio 145b, a volume adjuster 145c, and an icon group 145d in which a plurality of icons corresponding to the buttons of the remote control 1A are displayed, as items which can be set.

The type of audio 145b indicates a type of the audio information 52 shown in FIGS. 4A and 4B as an example. The type of audio 145b displayed in the setting items 145a shown in FIG. 7B is an example, and may be displayed so as to combine a type of language and a type of audio format.

Figure 8:
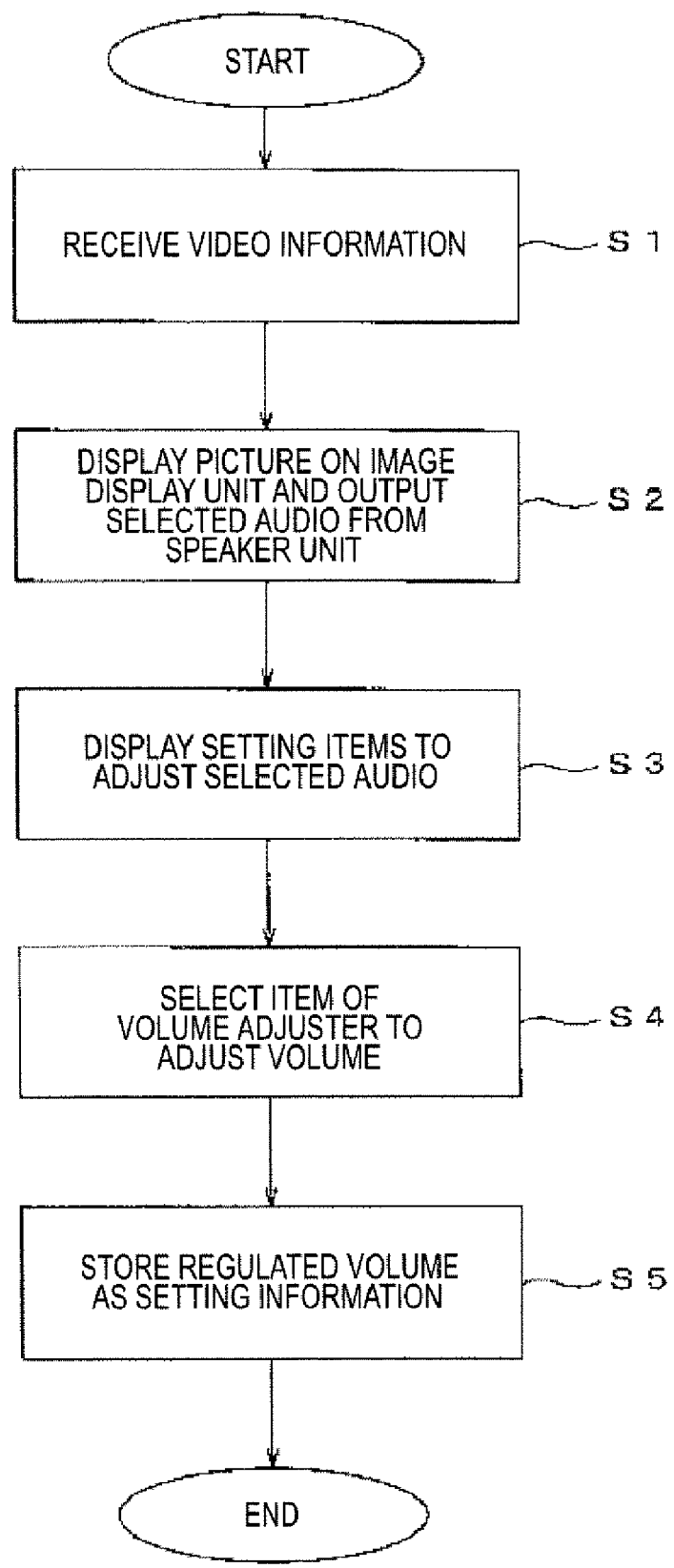
FIG. 8 is a flowchart with respect to a method of setting audio according to the embodiment of the present invention.

Hereinafter, operations of the image display apparatus in the present embodiment will be described in detail with reference to the respective diagrams. First, a method of setting audio will be described in accordance with a flowchart shown in FIG. 8.

The user turns on the electric power source of the image display apparatus 1, and operates the remote control 1A in order to view a desired program.

The control module 19 of the image display apparatus 1 receives an infrared command signal emitted from the remote control 1A via the infrared receiver 21, to determine a channel to receive a program based on the received command signal.

When the digital broadcast receiver 10 receives the video information 5 of a program supplied as a television broadcast from the digital broadcast station 3, via an antenna (not shown) (S1; Input step), the digital broadcast receiver 10 outputs the video information 5 to the signal processor 11. The signal processor 11 performs processing for encoding or the like with respect to the video information 5 to separate the video information 5 into the image information 51 and the audio information 52, and transmits the image information 51 to the image processor 12. At this time, as an example, the digital broadcast receiver 10 transmits the audio information 52 corresponding to a language set in advance in the image display apparatus 1 before factory shipment, to the audio processor 15.

The image information 51 is transmitted from the image processor 12 to the image quality processor 13, to be displayed as a picture on the image display unit 14. The audio information 52 is output from the speaker unit 16 via the audio processor 15 (S2; Output step).

When the volume of the audio output from the speaker unit 16 is higher or lower than a user's desired volume, the user operates the remote control 1A in order to adjust the volume level of the output audio, to display the setting items 140 of audio shown in FIG. 7A on the image display unit 14, and selects the volume (adjustment information) 145 via the remote control 1A.

When the control module 19 receives a command signal from the remote control 1A via the infrared receiver 21, the control module 19 displays the setting items 145a of audio shown in FIG. 7B on the image display unit 14 (S3; Setting item indicating step).

The user adjusts the volume adjuster 145c in the setting items 145a shown in FIG. 7B to be at the desired volume via the remote control 1A. Thereafter, the user presses a "MENU" button in the remote control 1A in order to set the regulated volume, to complete the setting (S4; Setting step).

The control module 19 sets the setting information 220 such that the volume information 221 is set to a value set by the volume adjuster 145c, the language information 223 is set to "French," the audio format information 224 is set to "AAC," and the input source information 225 is set so that the audio signal is input from the digital broadcast receiver 10. The control module 19 stores the setting information 220 in the HDD 22 (S5; Storage step), to complete the setting.

Figure 9:
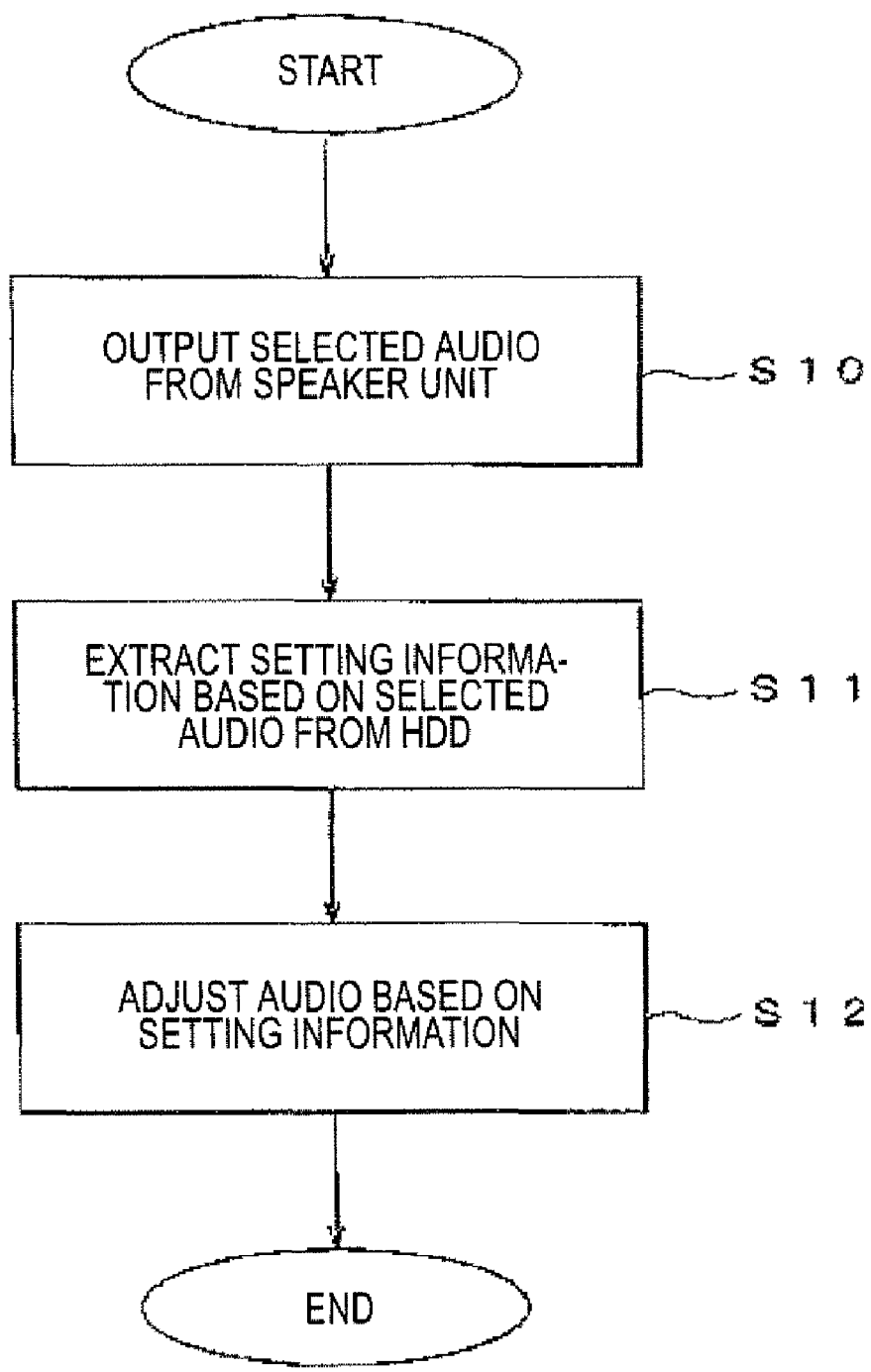
FIG. 9 is a flowchart with respect to a method for adjusting audio according to the embodiment of the present invention.

Next, the method for adjusting audio will be described in accordance with a flowchart shown in FIG. 9.

When a currently selected audio signal is not a user's desired audio in viewing a program, the user selects a desired language, for example, audio in "French" by the remote control 1A (S10; Selection step).

When the control module 19 receives a command signal to select "French" via the remote control 1A and the infrared receiver 21, the control module 19 controls the digital broadcast receiver 10 to transmit the audio information 52 corresponding to "French" to the signal processor 11. In the description herein, as an example, the type of the audio is assumed to be "AAC."

The identification module 19C of the control module 19 identifies that the language information 223 is set to "French," the audio format information 224 is set to "AAC," and the input source information 225 is set to receive the audio signal from the digital broadcast receiver 10, and the control module 19 extracts the setting information 220 corresponding to the identified result from the HDD 22 (S11; Extraction step).

When the setting information 220 corresponds to "French" exists, the control module 19 controls the audio processor 15 based on the setting information 220 to adjust, for example, the volume of the audio to output the audio from the speaker unit 16 (S12; Adjustment step).

Since the image display apparatus 1 is capable of storing volume of each different language as the setting information 220 even in a case in which a plurality of languages included in a program each has different volume, there is no need for a user to adjust the volume at the time of viewing an image in a same setting the next time, which is highly convenient.

Since the image display apparatus 1 is capable of storing volume of each different input source as the setting information 220 even in a case in which the input sources from which the video information 5 is input are different from one another and each input source has different volume, there is no need for the user to adjust the volume at the time of viewing an image input from a same input source next time, which is highly convenient.

Since the image display apparatus 1 is capable of storing volume of each type of a different audio format as the setting information 220 even in a case in which the types of the audio formats of the audio information 52 are different from one another and each type of the audio formats has different volume, there is no need for the user to adjust the volume at the time of viewing an image in a same audio format next time, which is highly convenient.

Since the image display apparatus 1 is capable of setting volume, sound quality, balance between right and left audio, and the like as the setting information 220, to adjust the audio by combining it with the above conditions, there is no need for the user to perform settings in detail, which is highly convenient.

The image display apparatus 1 may be configured to prepare the setting information 220 to adjust audio on each channel.

Further, in the present embodiment, the example of the image display apparatus as the electronic apparatus of the present invention has been described. However, the electronic apparatus of the present invention may be a personal computer. For example, the personal computer may be configured to be capable of adjusting audio depending on a language or the like as described above when the personal computer receives video information from a network. Further, the present invention can be applied to an electronic apparatus having a function of receiving a television broadcast or an electronic apparatus capable of using video information from an external device as an input source.

Moreover, the electronic apparatus of the present invention may be an electronic apparatus having a storage medium device that fetches video information therein via a storage medium built-in.

Although the embodiments according to the present invention have been described above, the present invention is not limited to the above-mentioned embodiments but can be variously modified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
   a receiving module configured to receive video information containing a plurality of pieces of audio information in different languages, the audio information being compressed in arbitrary audio compression formats;
   a configuration module configured to control displaying a configuration screen for enabling an adjustment of an audio volume for each of the audio compression formats, and to allow a user to set the adjustment on the configuration screen;
   a selection module configured to control displaying a selection menu for enabling a selection of languages, and to allow the user to select a language for audio output among the languages being displayed while the received video information is displayed; and
   a control module configured to adjust the audio volume according to the selected language referring to a configuration set by the configuration module.

2. The electronic apparatus of claim 1, wherein the audio compression format is any one of AC3 (Audio Code number 3), E-AC3 (Enhanced AC3), MPEG1 (Moving Picture Experts Group) L1/2/3, MPEG2 L1/2/3, AAC (Advanced Audio Coding), and HE-AAC (High-Efficiency Advanced Audio Coding).

3. The electronic apparatus of claim 2, wherein the control module is configured to generate configuration information including a set value of the audio volume corresponding to the audio compression format and correlating the selected language with the audio compression format.

4. The electronic apparatus of claim 3, wherein the control module is configured to adjust balance and audio quality while adjusting the audio volume.

5. A method for adjusting audio volume, the method comprising:
   receiving video information containing a plurality of pieces of audio information in different languages, the audio information being compressed in arbitrary audio compression formats;
   controlling displaying a configuration screen for enabling an adjustment of an audio volume for each of the audio compression formats, and allowing a user to set the adjustment on the configuration screen;
   controlling displaying a selection menu for enabling a selection of languages, and allowing the user to select a language for audio output among the languages being displayed while the received video information is displayed; and
   adjusting the audio volume according to the selected language referring to a configuration set by the configuration module.

6. An electronic apparatus comprising:
   a receiving module configured to receive video information that comprises a plurality of audio segments in different languages, the audio segments being compressed in one or more audio compression formats; and
   a control module configured to (1) control a display of a configuration screen that provides a user with an ability to adjust an audio volume for each of the audio compression formats, (2) control a display of a selection menu that enables selection of a language for audio output among the different languages while the received video information is displayed, and (3) adjust the audio volume according to the selected language referring to a configuration set by the configuration module.

7. The electronic apparatus of claim 6, wherein each of the plurality of audio segments is compressed in a different audio compression format.

8. The electronic apparatus of claim 6, wherein the one or more audio compression formats is AC3 (Audio Code number 3).

9. The electronic apparatus of claim 6, wherein the one or more audio compression formats is E-AC3 (Enhanced AC3).

10. The electronic apparatus of claim 6, wherein the one or more audio compression formats is a Moving Picture Experts Group (MPEG) based compression scheme.

11. The electronic apparatus of claim 6, wherein the one or more audio compression formats is AAC (Advanced Audio Coding).

12. The electronic apparatus of claim 6, wherein the one or more audio compression formats is HE-AAC (High-Efficiency Advanced Audio Coding).

13. The electronic apparatus of claim 6, wherein the control module is configured to generate configuration information including a set value of the audio volume corresponding to the audio compression format and correlating the selected language with the audio compression format.

14. The electronic apparatus of claim 13, wherein the control module is configured to adjust balance and audio quality while adjusting the audio volume.

15. The electronic apparatus of claim 6, wherein the receiving module is a digital broadcast receiver.

16. The electronic apparatus of claim 1, wherein the receiving module is a digital broadcast receiver.

17. The electronic apparatus of claim 6, wherein the control module comprises read only memory.

18. The electronic apparatus of claim 17, wherein the selection module comprises random access memory.

* * * * *